United States Patent
Lehmann et al.

(10) Patent No.: US 7,738,305 B2
(45) Date of Patent: Jun. 15, 2010

(54) READ-OUT CIRCUIT FOR OR IN A ROM MEMORY; ROM MEMORY AND METHOD FOR READING THE ROM MEMORY

(75) Inventors: Gunther Lehmann, Holzkirchen (DE); Yannick Martelloni, Munich (DE); Jean-Yves Larguier, Xi'an (CN); Gupta Siddharth, Noida (IN)

(73) Assignee: Infineon Technologies AG, Munich (DE)

( * ) Notice: Subject to any disclaimer, the term of this patent is extended or adjusted under 35 U.S.C. 154(b) by 400 days.

(21) Appl. No.: 11/803,852

(22) Filed: May 16, 2007

(65) Prior Publication Data

US 2008/0031054 A1    Feb. 7, 2008

(51) Int. Cl.
*G11C 7/02* (2006.01)
(52) U.S. Cl. .................... 365/189.15; 365/94; 365/104; 365/189.07; 365/205; 365/207; 365/208; 365/210.11; 365/210.12
(58) Field of Classification Search .................. 365/94, 365/104, 189.07, 189.09, 189.15, 205, 207, 365/208, 210, 210.11, 210.12
See application file for complete search history.

(56) References Cited

U.S. PATENT DOCUMENTS

| 5,459,693 | A | 10/1995 | Komarek et al. |
| 6,504,778 | B1 * | 1/2003 | Uekubo ................. 365/189.15 |
| 2001/0033514 | A1 * | 10/2001 | Takata et al. ........... 365/189.07 |
| 2003/0161183 | A1 * | 8/2003 | Tran ...................... 365/185.03 |
| 2005/0128836 | A1 * | 6/2005 | Nicholes ..................... 365/203 |

FOREIGN PATENT DOCUMENTS

WO    WO 2006/024403 A1 *    3/2006

* cited by examiner

*Primary Examiner*—Hoai V Ho
*Assistant Examiner*—Jay Radke
(74) *Attorney, Agent, or Firm*—Maginot, Moore & Beck

(57) ABSTRACT

A read-out circuit for or in a ROM memory, comprises an input, a comparator circuit, a threshold setting, and a control signal generator for driving the threshold setting generator. A read signal can be coupled into the input. The read signal, depending on the information contained in the read signal, comprises a high signal level relative to a reference potential or a low signal level relative to a reference potential. The comparator circuit compares the read signal with a settable threshold, the threshold setting circuit is designed for setting the threshold of the comparator circuit relative to the high and low signal levels, and the control signal generator generates a control signal similar to the read signal.

33 Claims, 9 Drawing Sheets

READ-OUT CIRCUIT FOR OR IN A ROM MEMORY; ROM MEMORY AND METHOD FOR READING THE ROM MEMORY

BACKGROUND OF THE INVENTION

The invention relates to a read-out circuit for or in a ROM memory, to a ROM memory and also to a method for reading the ROM memory.

Semiconductor memories are used for storing information in digital systems. Said memories are subdivided into different classes according to the type of information storage and different possibilities for writing the information to the semiconductor memory and reading it out again. Thus, a distinction is made between volatile and non-volatile memories, the non-volatile memories or else read-only memories including for example ROM memory (Read Only Memory) and the class of volatile memories including for example static and dynamic memories for example SRAM memory (Static Random Access Memory) or DRAM memory (Dynamic Random Access Memory).

The invention and also the problem area on which it is based are described below with reference to non-volatile semiconductor memories formed as ROM memories, but without restricting the invention thereto.

FIG. 1 of the drawings schematically shows an excerpt from a ROM memory—known internally to the applicant—with a sense amplifier for elucidating the general problem area. The ROM memory contains one or a plurality of memory cell arrays 1. Each of said memory cell arrays 1 contains a multiplicity of individual memory cells 2 arranged in matrix-type fashion in the respective memory cell array 1. A respective memory cell 2 contains a memory transistor that is formed as an n-channel field effect transistor—referred to hereinafter as NFET for short—and is designed to store a logic (digital) information item, for example a logic "1" (high level) or a logic "0" (low level). A supply potential VDD is applied to the gate terminals of the memory transistors 2 via word lines 4, by way of example, while an earth potential VSS is applied to the source terminals of the memory transistors 2 via respective connecting lines 5. In order to read a memory cell 2, the drain terminal thereof is connected to a bit line 3 to which a sense amplifier 6 is connected.

In this case, the sense amplifier 6 is formed as a simple inverter 6. A bit line multiplexer 7 having a plurality of selection transistors 8 is furthermore arranged between the input of the inverter 6 and the respective bit lines 3. The selection transistors 8 are designed to select a respective bit line 3 and connect it to the inverter 6. If a word line 4 is simultaneously activated, for example by application of a supply potential VDD, then the information stored in the memory cell 2 can be fed to the input of the inverter 6 via the respective selection transistor 8.

The read signal output of the memory cells 2 on to the respective bit line 3 during read-out is relatively weak in modern semiconductor memories, in particular on account of increasing miniaturization. The read signal must therefore be amplified by the sense amplifier 6.

In standby operation of a ROM memory, the latter ideally should have no power consumption. On account of parasitic leakage currents, which may have various causes, a ROM memory typically has a non-negligible power consumption in standby operation as well. The influence of the parasitic leakage currents is increasing further and further in particular on account of the increasingly smaller feature sizes and also on account of the gate oxide becoming ever thinner. Said parasitic leakage currents should be avoided as far as possible, particularly if the ROM memory is intended to be used for a mobile application in which the available power is limited and therefore constitutes a critical criterion. For these reasons, memory architectures designed for reducing the leakage currents are used inter alia in modern ROM memories.

A further problem consists in the fact that in a ROM memory typically different components are used within the memory cell array and the sense amplifier. In this case, variations in the choice of the different components can lead to the sense amplifier threshold varying to a greater or lesser extent. In particular, the case may occur, for example, in which the information representing a logic "1" on the one hand, and the information representing a logic "0" on the other hand, approximate to one another to an ever greater extent, which can be attributed for example to coupling effects of adjacent memory cells or their leads, process and technological variations and the like. Such coupling effects arise for example, when the respective bit lines are very long and the read signals passed on said bit lines are thereby influenced by adjacent lines and memory cell components. Moreover, a corruption of the information read out may also arise as a result of the threshold voltage of the memory cell transistor itself. This may consequently lead, if appropriate, to an erroneous read-out of the information stored in the memory.

The problem area mentioned above will be explained below with reference to the voltage-time diagrams in FIGS. 1*a* and 1*b*. FIG. 1*a* shows the case in which a logic "0" is to be read (Read 0), from a memory cell designated by reference symbol 2' in FIG. 1, whereas in the case of FIG. 1*b* a logic "1" (Read 1) is intended to be read out from another memory cell 2". In FIG. 1, in this case, the potentials on the corresponding word lines 4 are designated by WL0-WL3, the different potentials on the supply lines 5 are designated by VVDD0-VVDD3 and the potentials on the bit lines 3 are designated by BL0-BL3.

For a read operation for reading out a "0", the ideal potential BL2 on a bit line is 0 volts. On account of the above mentioned coupling effects, however, an additional positive potential occurs on the bit line 3 if a supply line 5 and hence a corresponding memory cell 2 are switched on. On account of this so-called "cross-coupling" effect of the bit line 3 to adjacent lines of adjacent memory cells, at the beginning of the activation of the supply line 2, the potential BL2 on the corresponding bit line 3 is concomitantly pulled up somewhat and subsequently falls again somewhat (see FIG. 1*a*). An additional rise in the potential on the bit line 3 results on account of leakage currents of memory cells which are connected to the same bit line 3 but are not activated via the corresponding word line 4. These phenomena just mentioned are all the more serious, the greater the length with which the corresponding bit line 3 is formed. As illustrated in FIG. 1*a*, the potential BL2' (upper BL2 curve) for a comparatively long line is significantly higher than the corresponding potential BL2 of a correspondingly shorter bit line (lower BL2 curve).

In the case of a read operation for a logic "1", the ideal potential BL0 on the bit line 3 corresponds to the maximum supply potential VDD. The actual value of the potential BL0 on the bit line is significantly lower, however. This is due, inter alia, to the fact that a voltage is dropped across the channel of the corresponding NFET of the memory cell whose information is currently being read out. Moreover, the potential of the read signal also depends on the length of the bit line 3 in the same way. Consequently, for long bit lines 3, the corresponding bit line potential BL0 (BL0 lower curve in FIG. 1*b*) is significantly lower than the supply potential VDD (see FIG. 1*b*).

The decision threshold employed by the sense amplifier for the definition of a logic "0" and a logic "1" ideally amounts to half the supply voltage VDD. As can be discerned in FIGS. 1a and 1b, however, the switching threshold actually greatly depends on the construction of the ROM memory used, and in this case in particular on the length of its bit lines and the type and number of the components used. Moreover, said switching threshold also depends on process and technological variations during production.

What is problematic about the inverter used as a sense amplifier in FIG. 1, however, is that its threshold is fixedly predetermined and therefore cannot be adapted to the variation of the switching threshold just mentioned. However, since the bit line potentials BL0-BL3 for a "0" and "1", as shown in FIGS. 1a and 1b, approximate to one another depending on the parameters just mentioned, incorrect decisions may occur if appropriate, in the sense amplifier, that is to say that a logic "1" is identified as logic "0" and vice versa. In particular, this applies to the beginning of a read operation in which, for a read operation for a "0" at the start of the read-out, the bit line potential BL2 follows the potential VVDD2 on the supply line 5 somewhat. This means that the information stored in the corresponding memory cells can no longer be read out unambiguously, which should be avoided.

BRIEF SUMMARY OF THE INVENTION

In one aspect of the invention, a read-out circuit for or in a ROM memory, comprises an input, into which a read signal can be coupled, said read signal, depending on the information contained in the read signal, comprises a first, high signal level relative to a reference potential or a second, low signal level relative to a reference potential, comprises a comparator circuit for comparing the read signal with a threshold that can be set, having a threshold setting circuit designed for setting the threshold of the comparator circuit relative to the first and second signal levels of the coupled-in read signals, having a control signal generator, which generates a control signal similar to the read signal in particular to the read signal having the low signal level, for the purpose of driving the threshold setting device.

In a further aspect of the invention, a ROM memory comprises at least one memory cell array comprising a plurality of leakage-current-optimized ROM memory cells, comprises a read-out circuit, by means of which read information can be read out from at least one memory cell, comprises a bit multiplexer circuit arranged between the memory cell array and the read-out circuit, said bit multiplexer circuit connecting a memory cell that is to be read with regard to the stored information to the read-out circuit for a read-out operation.

In another aspect of the invention, a method for reading a ROM memory, comprises the steps of: reading out information from a memory cell; coupling a read signal containing the information into a read-out circuit, said read signal, depending on the information contained, comprising a first, high signal level relative to a reference potential or a second, low signal level relative to a reference potential; setting a threshold of a comparator circuit relative to the first and second signal levels of the coupled-in read signals, a control signal similar to the coupled-in read signal, in particular to the read signal, comprising the low signal level being generated for the purpose of setting the switching threshold; comparing the read signal with the threshold set.

The idea on which the present invention is based consists in equipping a leakage-current-optimized semiconductor memory with a sense amplifier correspondingly optimized and adapted thereto. The leakage-current optimized semiconductor memory comprises a memory cell array whose word lines, bit lines and supply lines in each case have applied to them the identical and in particular preferably the same reference potential, for example, the reference-earth potential, in standby operation. In order to read out the content of a respective memory cell, a second supply potential, for example a positive supply potential, is applied to a corresponding supply line and the word line thereof for a time required for the read-out. Afterwards, the charge stored in the corresponding memory cell and hence the information representing this charge can be read out via the bit line and the sense amplifier. The sense amplifier may to comprise the same components, that is to say the same types of transistor with the same dimensions as the transistors of the bit line multiplexer.

It is furthermore essential for the sense amplifier to have a reference bit line that simulates the behaviour on a regular bit line containing a logic "1" and a logic "0".

During the read-out of the semiconductor memory, the orientations of coupling effects, effects stemming from variations of the production technology or process parameters, parasitic effects and the repercussions thereof may be reduced or avoided.

The comparator circuit may provide an output signal at an output, said output signal being assigned a first, high or a second, low logic level depending on the comparison of the read signal with the currently set threshold.

The comparator circuit may have two cross-coupled inverters.

The threshold setting circuit may be arranged between the input and the comparator circuit.

The threshold setting circuit may comprise at least two first transistors, which are connected to an input on the control side and which, relative to their controlled paths, are arranged in parallel with one another between a supply terminal and the comparator circuit.

The threshold setting circuit may have at least one second and one third transistor, which, relative to their controlled paths are arranged in parallel with one another between a supply terminal and the output, the second transistor being connected to a reference input on the control side, into which reference input a reference read signal similar to the read signal can be coupled and the third transistor is connected on the control side to a control input for coupling in the control signal.

The transistors of the threshold setting device may be arranged symmetrically with respect to one another.

The threshold setting device may be formed in such a way that, during a read-out operation, the control terminal of the third transistor has the same gate-source coupling as the control terminals of the first and second transistors as a result of the control signal.

The control signal generator may comprise a fourth transistor, which corresponds to a transistor of a memory cell which can correspondingly be connected to the read-out circuit and which is always turned on as a result of its driving and which feeds the reference potential to a control terminal of the third transistor via its controlled path.

The control signal generator may have a fifth transistor, the control terminal of which is connected directly to the control terminal of the third transistor and the load terminals of which are short-circuited with one another and have the reference potential VSS applied to them.

At least two read-out circuits may be provided which are connected to a respective memory cell array via respective data lines.

At least two read-out circuits may be at least partly be assigned the same threshold setting circuit.

The at least two read-out circuits may be assigned the same control signal generator.

A precharged device may be provided for precharging an input-side node, an output-side node and/or a supply-side node within the threshold setting device with a predetermined potential, in particular with the reference potential.

At least one device for load compensation may be provided, which is/are assigned to a reference bit line and/or to a control line provided for the control signal and which serves/serve for the compensation of a load on the reference bit line and/or the control line.

One embodiment of the ROM memory may provide a plurality of word lines, bit lines and supply lines, the word lines, the bit lines and the supply lines of a memory cell array in each case having the identical reference potential applied to them in standby operation.

A potential of 0 volts may be provided as the reference potential.

The memory cells of the memory cell array in each case may comprise a first terminal connected to a word line and also a second terminal and a third terminal, the second terminal being connected to a bit line and/or the third terminal being connected to a supply line for precharging the third terminal.

At least one of the memory cells may comprise a memory transistor formed as an n-channel transistor, in particular as an NMOS transistor.

The memory transistor may comprise a fourth terminal, which forms the substrate terminal of the memory transistor and to which the reference potential is applied in standby operation.

At least one memory cell may be designed for storing a first logic level, in which the second terminal is connected to the bit line and the third terminal is connected to the supply line and in which the same reference potential is applied to all the terminals.

At least one memory cell may be designed for storing a second logic level, in which the second terminal is connected to the bit line or the third terminal is connected to the supply line, and in which the same reference potential is applied to the terminal connected to the bit line and to the supply line, respectively, and also the first terminal.

The first logic level may denote a logic high level ("1") and the second logic level may denote a logic low level ("0").

A device for precharging the supply lines may be provided, which is designed for charging to a first potential, directly prior to a read-out of a memory cell at least the supply line assigned to said memory cell to be read.

A respective bit line may be assigned at least one selection transistor arranged with its controlled path between the bit line assigned to said selection transistor and the read-out circuit.

The selection transistor may be formed as an n-channel transistor, in particular as an NMOS transistor.

The memory cell array may have a reference column comprising a plurality of reference memory cells, which is connected to the reference input of the read-out circuit, in which case, during a read-out operation, a reference read signal is simultaneously read out from a reference memory cell corresponding to the memory cell read and is fed to the reference input.

The bit multiplexer circuit may comprise a reference selection transistor corresponding to the selection transistor, said reference selection transistor being arranged with its controlled path between the read-out circuit and the reference memory cells of the reference column.

In one embodiment, the inventive method may comprise the further step of: outputting an output signal, which is assigned a first, high or a second, low logic level depending on the comparison of the read signal with the currently set threshold.

An input-side node, an output-side node and/or a supply-side node within the threshold setting device may be precharged with a predetermined potential, in particular with the reference potential, prior to a read-out operation.

BRIEF DESCRIPTION OF THE SEVERAL VIEWS OF THE DRAWINGS

The invention is explained in more detail below on the basis of the exemplary embodiments specified in the schematic figures of the drawings in which.

In the figures of the drawing, identical and functionally identical elements, features and signals are provided with the same reference symbols, unless specified otherwise.

DETAILED DESCRIPTION OF THE INVENTION

Figure 1:
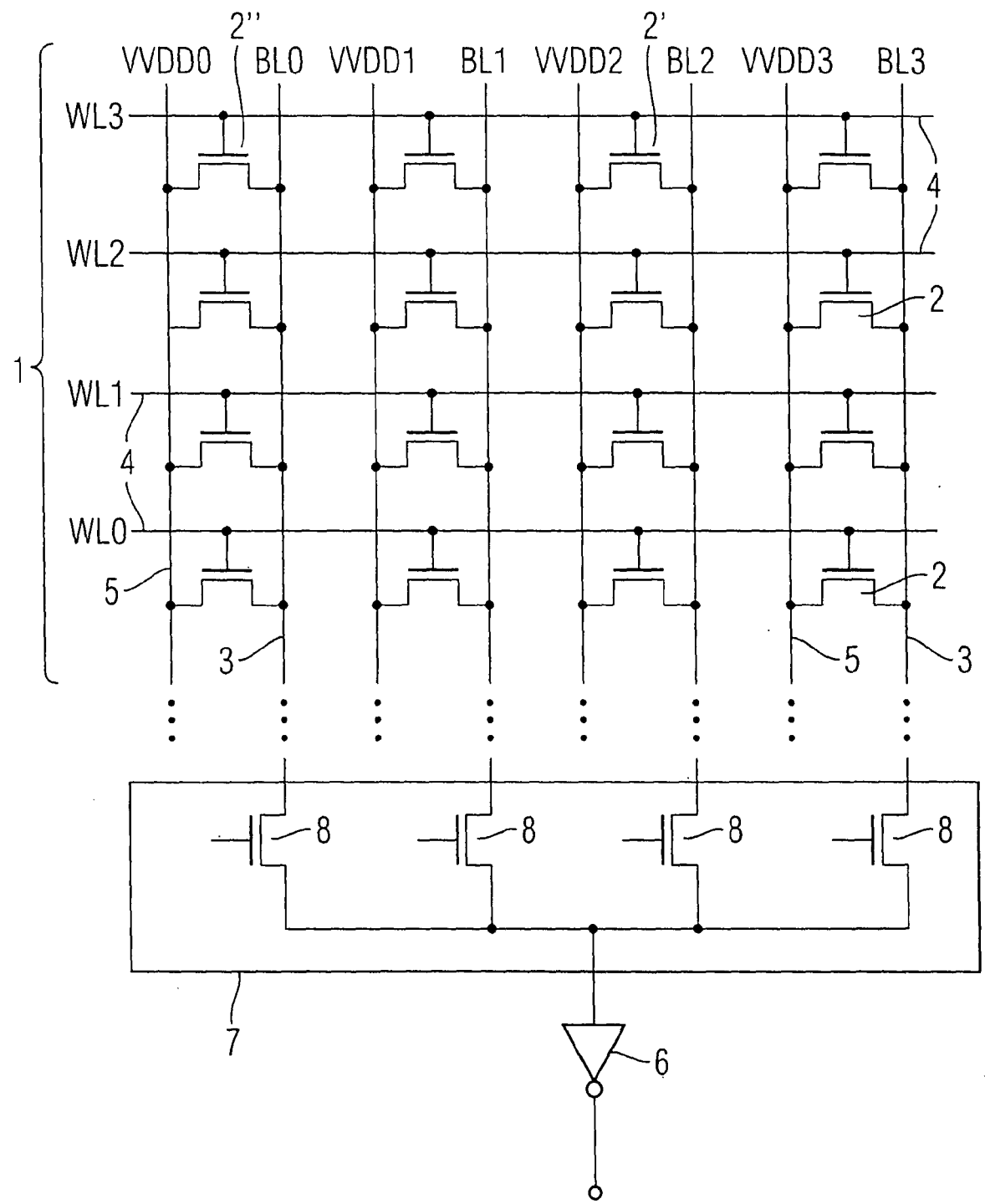
FIG. 1 is a block diagram of a ROM memory having a memory cell array and a sense amplifier for elucidating the general problem area.
Figure 1A:
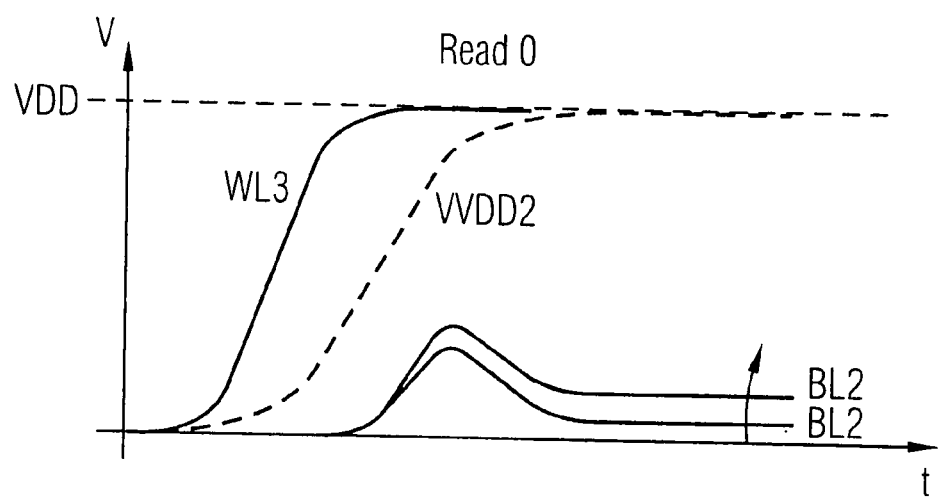
FIGS. 1*a*, 1*b* are voltage-time diagrams for illustrating a read-out operation for a "0" and a "1" in the case of a ROM memory from FIG. 1.
Figure 1B:
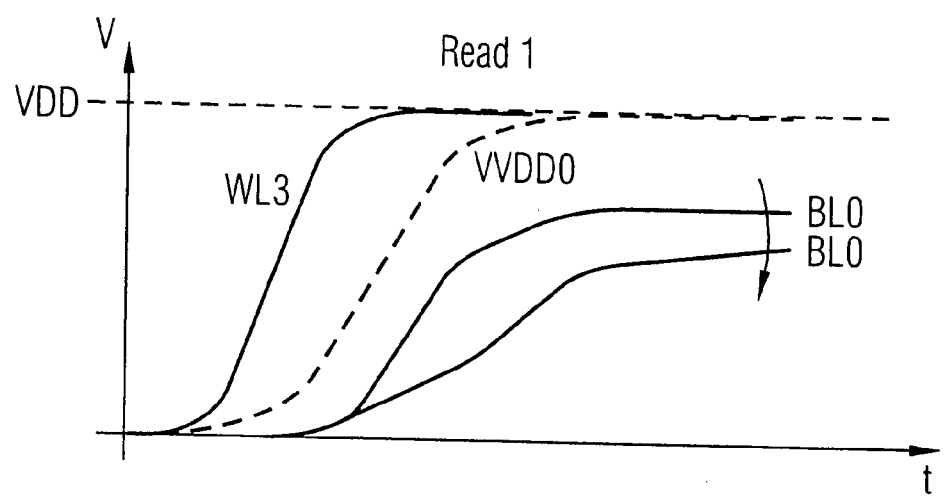
Figure 2:
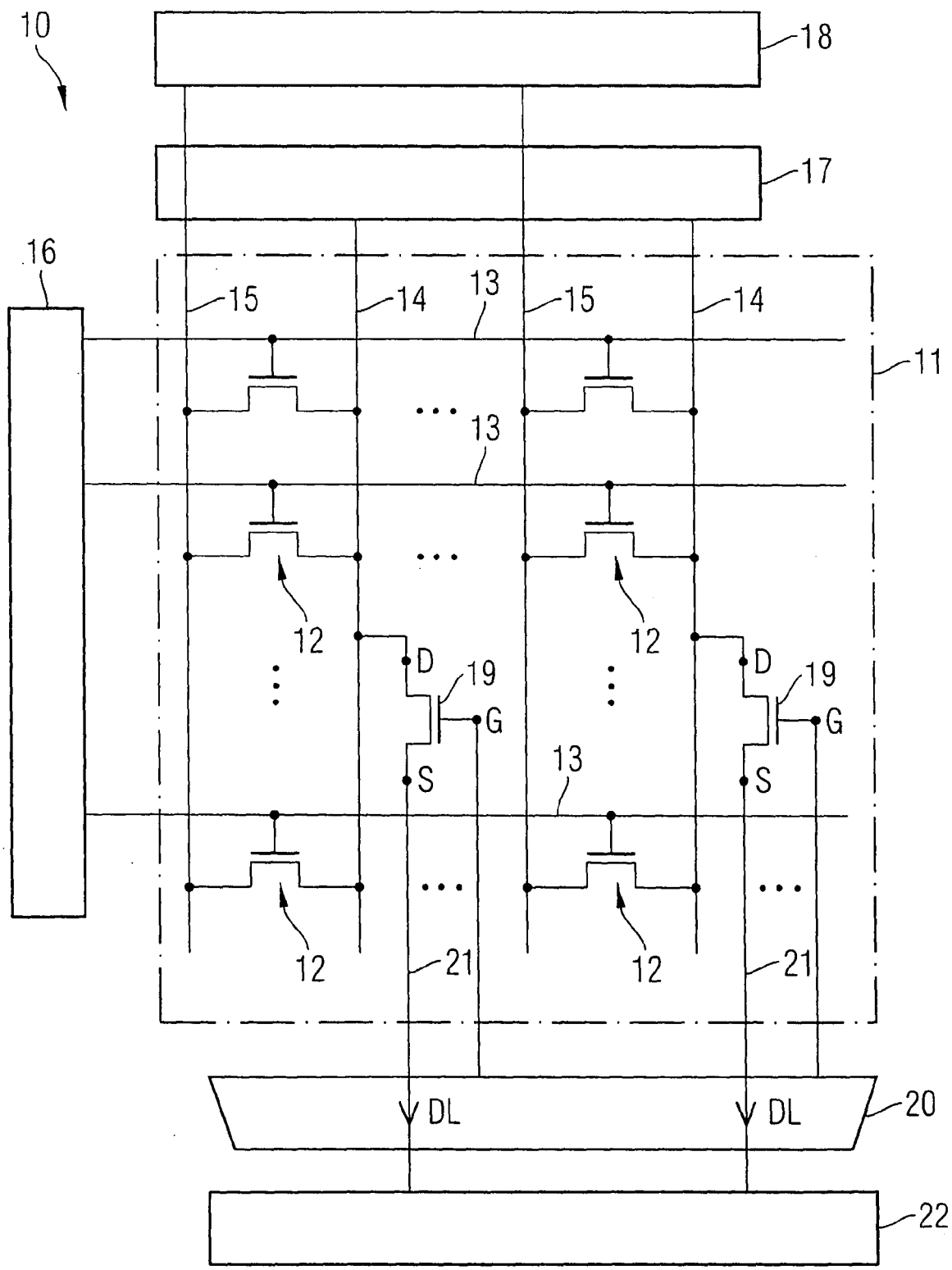
FIG. 2 is a block diagram of a general first exemplary embodiment of a ROM memory.

FIG. 2 shows a block diagram of a general first exemplary embodiment of a memory component according to the invention. The memory component, which is designated by reference symbol 10, is in this case formed as a ROM memory. The memory component 10 has a memory cell array 11, which, in the present exemplary embodiment, is constructed from a multiplicity of individual ROM memory cells 12. The memory cells 12 are arranged in a matrix-type fashion in rows and columns in a known manner, each row being assigned a word line 13 and a respective column being assigned a bit line 14 and also a supply line 15. The various word lines 13 are connected to a row decoder 16, the bit lines 14 are connected to a column decoder 17 and the supply lines 15 are connected to a precharge circuit 18.

The construction and the structure of a ROM memory cell 13 will be discussed in detail below with reference to FIGS. 8 and 9.

For a read-out operation, each bit line 14 is in each case assigned at least one selection transistor 19. In the present exemplary embodiment, both the selection transistors 19 and the memory transistors 12 are formed as NFETs. The drain terminal D of the selection transistor 19 is connected to the bit line 14, the source terminal S is connected via a data line 21 to a read-out circuit 22.

It shall be assumed that the selection transistor 19 is part of the bit multiplexer circuit 20, even though the selection transistor 19 has not been represented within said bit multiplexer circuit 20 in FIG. 2, for the sake of better clarity. For the selection of a respective bit line 14 for a read-out process, that is to say for the selection of an individual or some specific bit lines 14 within the memory cell array 11, the bit multiplexer circuit 20 generates a corresponding control signal for driving the gate terminal G of a selection transistor 19 assigned to the respective bit line 14. The respective selection transistor 19 is thus switched on, whereby the bit line 14 is connected to the read-out circuit 22 via the controlled path, that is to say the drain-source load path, of the selection transistor 19. The information stored in a specific memory cell 12, said information being manifested as corresponding charge on the bit line 14, can thus be read out via the read-out circuit 22. The read-out circuit 22 which will be discussed thoroughly, with reference to the subsequent FIGS. 3-7, is designed to amplify and forward the signal representing the respective information in a memory cell 12, which signal may be embodied in relatively weak fashion, for a subsequent evaluation.

Figure 3:
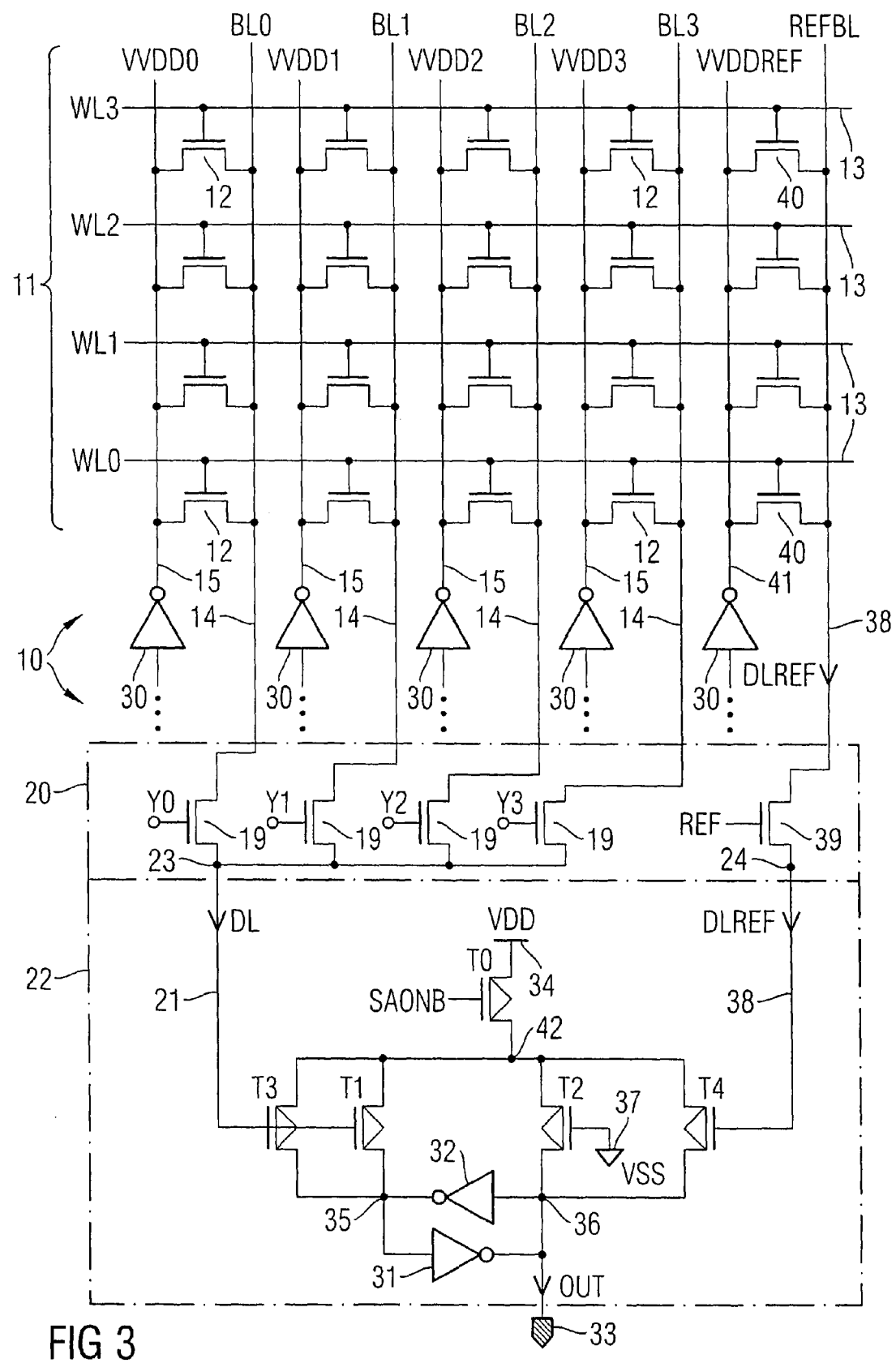
FIG. 3 is a detailed second exemplary embodiment of a ROM memory comprising a sense amplifier.

FIG. 3 shows, on the basis of a schematic circuit diagram, an excerpt from a simplified ROM memory having a multiplexer circuit and sense amplifier for illustrating a further exemplary embodiment of the invention. In this case the memory cell array 11 of the ROM memory 10 is formed as a 4×4 memory matrix, which therefore has 4 columns and 4 rows and thus a total of 16 memory cells 12. As in FIG. 2, here too, the individual memory cells 12 for storing the corresponding information contain NFETs. Moreover, each supply line 15 is equipped with an inverter 30 designed for driving a corresponding potential VVDD0-VVDD3 on the corresponding supply line 15.

In FIG. 3, in this case, the potentials on the corresponding word lines 13 are designated by WL0-WL3, the various potentials on the supply lines 15 are designated by VVDD0-VVDD3 and the potentials on the bit lines 14 are designated by BL0-BL3.

The bit multiplexer circuit 20 has a number of selection transistors 19 corresponding to the number of columns, each selection transistor 19 being connected to an assigned bit line 14. On the control side, a respective selection transistor 19 is driven by means of control signals Y0-Y3. On the memory cell array side, the respective selection transistors 19 are connected by their first load terminal to a respective bit line 14. By the respective other load terminal, the various selection transistors 19 are short-circuited with one another and connected to a common data line 21.

Said data line 21 is designed for forwarding a corresponding data signal DL. Said data signal DL contains an item of information read out, a memory cell 12 that has been selected via corresponding bit lines 14 and word lines 13. The data signal DL is fed to the read-out circuit 22 for further evaluation to the effect of whether the information contained in the data signal DL is assigned to a logic "0" or a logic "1". In the present exemplary embodiment, the read-out circuit 22, which is also referred to hereinafter as sense amplifier circuit, has two inverters 31, 32 coupled back-to-back, which, in this case function as a comparator circuit. The first of the two inverters 31 is connected on the input side, if appropriate via further circuits, to the data line 21 and on the output side to the output terminal 33 for outputting an output signal OUT. The second of the two inverters 32 is arranged in antiparallel with the first inverter 31 and serves for the feedback of the signal on the data line DL that has been compared by means of the first inverter 31. Consequently, a comparator circuit 31, 32 with positive feedback is thus realized. It goes without saying that said comparator circuit 31, 32 can also be formed in some other way, for example by means of only one inverter or a cascade connection of a plurality of inverters.

Moreover, the ROM memory 10, and in particular the read-out circuit 22 thereof, is equipped with a device for setting the threshold of the comparator circuit 31, 32. This circuit, which is referred to hereinafter as threshold setting circuit, will be described in detail below in FIGS. 4-7.

In the exemplary embodiment in FIG. 3, the read-out circuit 22 for example, p-channel MOSFET transistors—referred to hereinafter as PFET for short. Two of said PFETs T1, T3 are connected to the data line 21 on the control side. The controlled paths of said transistors T1, T3 are arranged in parallel with one another. In this case, their supply-side load terminals are connected via a selection transistor T0 to a first supply terminal 34, to which a first, for example a positive, supply potential VDD is applied. The selection transistor T0 is driven by a control signal SAONB. The output-side terminals of the transistors T1, T3 are connected via a common node 35 to the comparator circuit 31, 32 and here in particular to the input of the first inverter 31.

The other two transistors T2, T4 likewise are arranged in parallel with one another with regard to their controlled paths, their supply-side terminals being connected to the supply terminal 34 via the selection transistor T0. Their output-side terminals are connected directly to the output 33 via a node 36 of the comparator circuit 31, 32. The transistor T2 is connected on the control side to a second supply terminal 37, to which a second supply potential, for example a reference potential VSS is applied. The transistor T4 is connected on the control side to a reference bit line 38, to which a reference data signal DLREF is applied. Said reference bit line 38 is connected to a reference part of the memory cell array 11 via a further selection transistor 39. Said selection transistor 39 is part of the bit multiplexer circuit 20 and at the same time also part of the threshold setting circuit. The selection transistor 39 is driven by means of a reference signal REF specially provided for it.

An additional so-called reference column is provided on a reference side of the memory cell array 11. Said reference column contains a total of four reference memory cells 40, that is to say a number of reference memory cells 40 corresponding to the number of rows. The reference column with the four reference memory cells 40 is likewise part of the threshold setting circuit. Said reference memory cells 40 are driven via the same word lines 13 as the memory cell 12. On the supply side, the NFETs of the reference memory cells 40 are connected to a supply line 41, to which a supply potential VVDDREF is applied. Upon corresponding activation of a reference memory cell 40 via a corresponding word line 13 and supply line 41, a reference data signal DLREF containing an item of information of the corresponding reference memory cell 40 can be read out via the reference bit line 38 and be fed to the control input of the transistor T4 via the controlled path of the selection transistor 39.

The pair of cross-coupled inverters 31, 32 is therefore controlled via the outputs of the transistors T1-T4. The transistors T1-T4 are preferably dimensioned identically, that is to say that they have the same channel lengths and channel widths and also preferably the same oxide thicknesses of the gate oxide. The transistors T1-T4 are arranged symmetrically with regard to the their controlled paths and with regard to their supply voltage, which results in particular on account of the identical size of the transistors T1-T4. However, it is also sufficient if only the transistors T3, T4 are constructed identically to one another and the transistors T1, T2 are constructed identically to one another.

On account of the driving of the control terminal of the PFET T2 by the reference potential VSS, the transistor T2 is always switched on. In a minimal variant, however, it would also be conceivable to dispense with the transistor T2. However, the transistor T2 is particularly advantageous for symmetry reasons, in particular. Moreover, the transistor T2 is also advantageous for reducing parasitic capacitances.

The functioning of the threshold setting circuit in connection with the ROM memory 10, and in particular the read-out circuit 22 thereof, is explained below:

During a read-out operation of a specific memory cell 12 of the memory cell array 11, the content thereof is fed to the cross-coupled inverters 31, 32 via the data line 21 and the transistors T3, T1. At the same time, the content of a corresponding reference memory cell 40 is also read out via the reference bit line 38. Particularly during a read-out operation for a logic "1", the reference bit line 38 exhibits the same behaviour as the corresponding bit line 14 which is connected to the memory cell 12 to be read. In particular, the lengths of the corresponding bit line 14 and of the reference bit line 38 are preferably also formed in a manner identical in length or at least similar in length. The selection transistor 39 of the bit multiplexer circuit 20 also behaves in the same way as the corresponding selection transistor 19 which selects the corresponding bit line 14. During a read-out operation, said reference bit line 38 maps a voltage profile of a data signal DL to be read out on the bit line 14, that is to say that the reference data signal DLREF would correspond to the data signal DL in this case. This is particularly because the elements of the threshold setting circuit and in this case in particular the reference cells 40, the reference bit line 38, the reference selection transistor 39 and the transistors T2, T4 correspond to the corresponding elements on the memory cell array side. In this way, in terms of its voltage profile during the read-out operation, the reference bit line behaves more or less like a bit line on which a "1" is currently being read out.

The idea of the present invention consists in providing, for the formation of a differential signal for the sense amplifier, a reduction of the influence of the voltage of the reference data signal DLREF on the comparator circuit, a halving of the influence in the present exemplary embodiments. This is done by virtue of the fact that on the memory cell array 11 side, two (or else more) transistors T3, T1 are driven by means of the corresponding data signal DL on the data line 21, whereas on the reference side only a single transistor T4 is driven by means of the reference data signal DLREF on the reference bit line 38. The transistor T2 is driven by the reference potential VSS. The transistors T1, T3, T4 are therefore turned on by means of the signals DL, DLREF functioning as control signals. The transistor T0 is switched on beforehand by means of the control signal SAONB, with the result that the positive supply potential VDD is already applied to the transistors T1, T3, T4 prior to turn-on. The transistors T1, T3, T4 thus act as a current divider, in which case at the beginning of a read-out operation for a logic "0" for instance precisely double the current flows via the controlled paths of the transistors T1, T3 on the memory cell side as via the controlled path of the transistor T4 on the reference side. In this way indeed, more or less independently of process fluctuations, technological fluctuations and independently of the choice of the components used, the threshold of the respective inverter 31 can be set ideally to the centre of the maximum voltage swing DL-VSS during the read-out of a logic "1" which can be obtained here. In this way, a data signal DL that has been read out can be assigned very exactly to a logic "0" or a logic "1".

Figure 4:
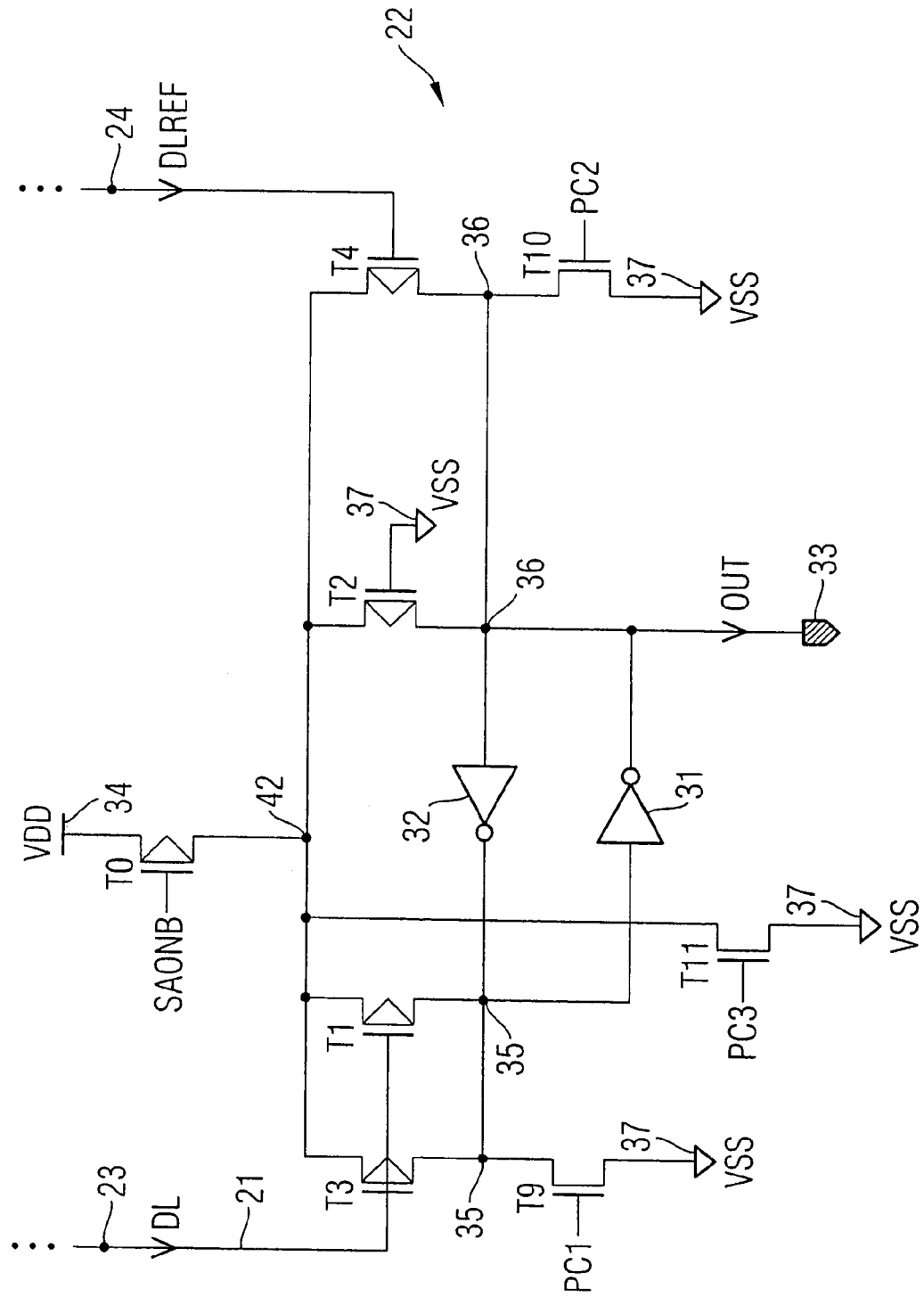
FIG. 4 is a block diagram of a first exemplary embodiment of a sense amplifier for the ROM memory from FIG. 3.

FIG. 4 shows a block diagram of a first exemplary embodiment of a sense amplifier for the ROM memory from FIG. 3. The bit multiplexer circuit 20 and also the memory cell array 11 have not been illustrated here for the sake of better clarity.

The read-out circuit 22 comprises three additional transistors T9, T10, T11. These transistors T9-T11 serve for pre-charging nodes of the read-out circuit 22 and are also referred to as charging transistors T9-T11 or as so-called pre-charge transistors. The charging transistors T9-T11 are driven respectively by means of control signals PC1-PC3. On the supply side, the transistors T9-T11 in each case are connected to the second supply terminal 37 and therefore have the reference potential VSS applied to them on the supply side. On the output side, the transistor T9 is connected to the node 35 at the common output of the two transistors T1, T3. The transistor T10 is connected on the output side to the node 36 at the common output of the two transistors T2, T4. The transistor T11 is connected on the output side to a common node 42 between the selection transistor T0 and the transistors T1-T4 short-circuited on the supply side.

If the transistors T9-T11 are switched on by respective control signals PC1-PC3, then the reference potential VSS is applied to the corresponding nodes 35, 36, 42 and the latter are thus put into a defined charge state. In this way, the corresponding nodes 35, 36, 42 and thus the sense amplifier of the read-out circuit 22 can be put into a predefined state prior to a read operation.

Usually, the transistors T9-T11 are switched on shortly before a read-out operation, with the result that the corresponding nodes 35, 36, 42 have already been charged to the defined potential upon read-out. Said transistors T9-T11 are switched off again preferably directly before the read-out operation, with the result that shunt currents that would lead to losses cannot arise between the charging transistors T9-T11, on the one hand and the transistors T0-T4 of the sense amplifier 22, on the other hand, during the read-out operation.

Figure 5:
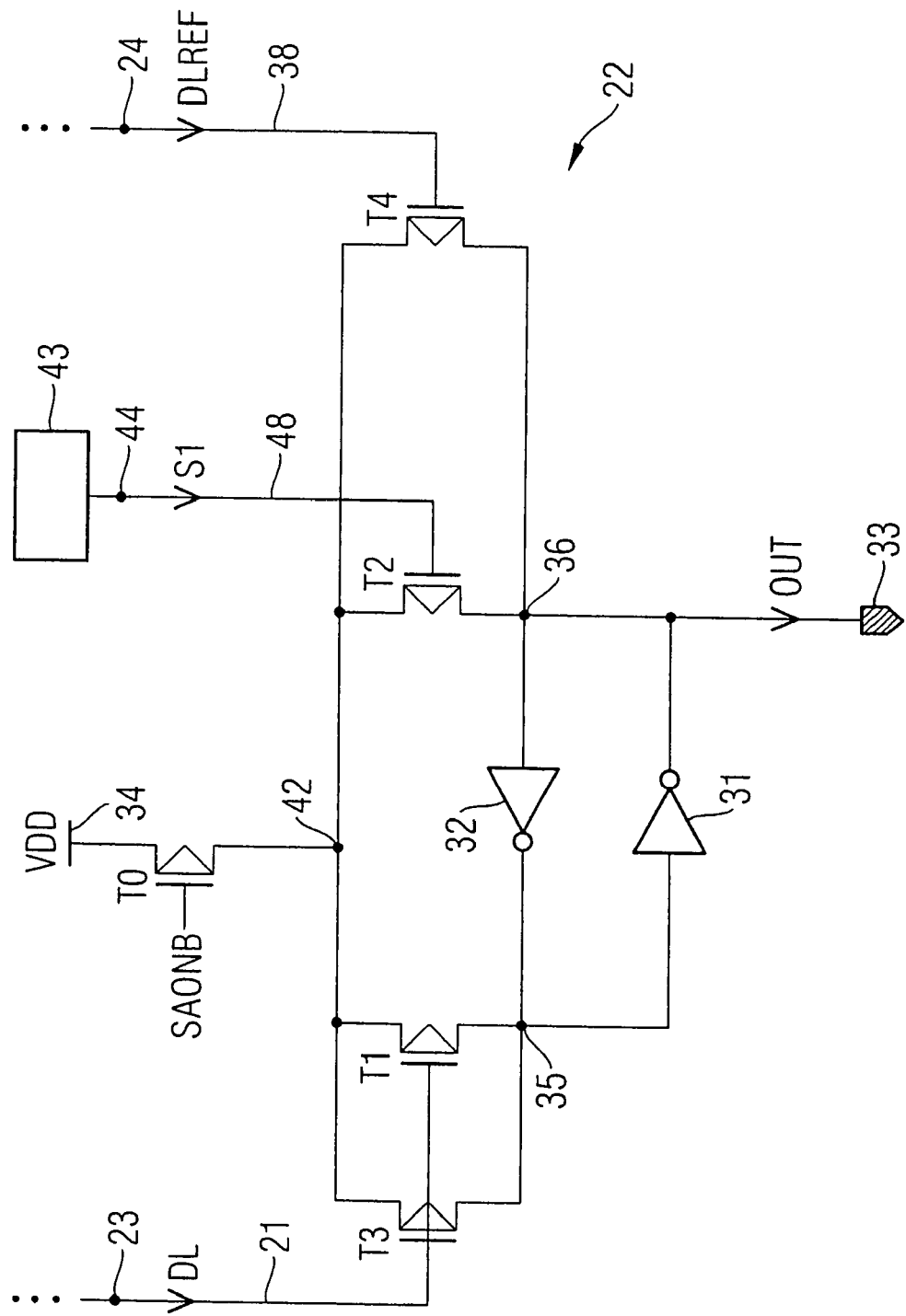
FIG. 5 is a block diagram of a second exemplary embodiment of a sense amplifier for the ROM memory from FIG. 3.

FIG. 5 shows a block diagram of a second exemplary embodiment of a sense amplifier for the ROM memory from FIG. 3.

In contrast to the exemplary embodiment in FIG. 3, here the reference potential VSS is not applied to the control terminal of the transistor T2. A circuit 43 for generating a reference-potential-like signal S1 is provided here. This involves a signal S1 corresponding to the reference potential VSS. Said circuit 43 functions as a control signal generator. In contrast to the exemplary embodiment in FIG. 3, in which the control terminal of the transistor T2 is rigidly connected to the reference potential VSS, the potential of said signal S1 is indeed not fixedly predetermined. A signal similar to the reference potential VSS is involved here which takes account of coupling effects (e.g. Miller coupling) via the gate capacitances of the various elements and transistors of the sense amplifier and of the various memory cell transistors and the leads thereof. In these elements just mentioned, coupling effects can occur via the corresponding gate capacitances of the respective transistors, which are also then reflected in the signal S1.

If the transistor T0 is switched on, the control terminal of the transistor T2 acquires the same gate-source coupling as the remaining transistors T1, T3, T4. Without corresponding driving of the transistor T2 by the circuit 43, a predetermined reference potential VSS would be applied rigidly to said transistor, which would lead to an undesirable mismatch. Since the various transistors T1-T4 for the defined setting of the threshold of the inverters 31, 32 are intended to be arranged as symmetrically as possible with respect to one another, it is also necessary for their gate capacitances to have as far as possible an identical or at least similar coupling. For this reason, the control terminal of the transistor T2 is driven with a control signal S1 via the circuit 43 in such a way that the control terminal of the transistor T2 behaves similarly to the control terminals of the transistors T3, T1 on the one hand, and the control terminal of the transistor T4 on the other hand. In this way, all of the transistors T1-T4 have an approximately similar switch-on behaviour, even though the transistor T2 is precisely not driven by corresponding data signals DL or data reference signals DLREF. By means of the circuit 43, it is therefore possible for the transistor T2 to be driven with an optimized signal S1 such that an optimum symmetry of the transistors T1-T4 of the sense amplifier 22 is ensured.

Figure 6:
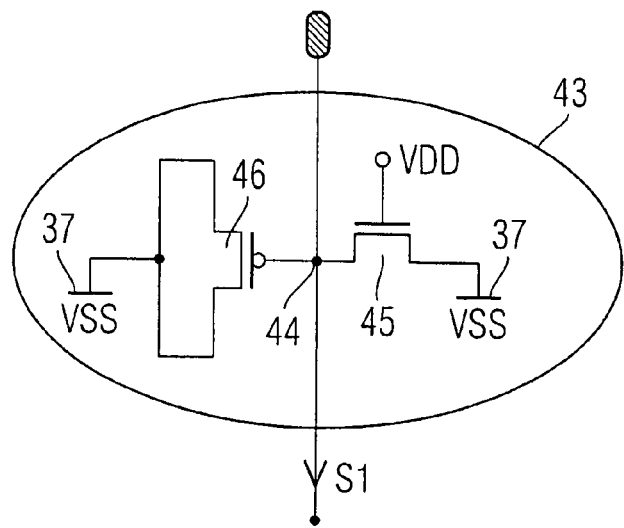
FIG. 6 is an exemplary embodiment of a device for setting a control potential for a sense amplifier such as is illustrated in the exemplary embodiment of FIG. 5.

FIG. 6 shows an exemplary embodiment of such a circuit 43 for generating a control signal S1 for the transistor T2. The circuit 43 contains an NFET 45 and a PFET 46. The NFET 45 corresponds to a corresponding NFET of a selection transistor. The NFET 45 is connected by its controlled path between the node 44 and the supply terminal 37. The supply potential VDD is applied to the control terminal of the NFET 45, with the result that the latter is always switched on. Since the NFET transistor 45 is always switched on, a potential that is similar to the reference potential VSS is consequently always applied to the node and hence the control line 48. In this way, there is not a rigid connection to the reference-earth potential VSS. Rather, said potential VSS is transmitted via the controlled path of the NFET 45 on to the data line 48.

A PFET 46 is additionally provided, the control terminal of which is connected directly to the node 44 and thus to the control line 48. Since the signal S1 that is close to the reference potential VSS is applied to the control terminal of said PFET, the PFET 46 is always switched on. The load terminals of the PFET 46 are short-circuited with one another and connected to the supply terminal 37 and hence to the reference potential VSS. The PFET 46 is designed to model the various capacitances of the sense amplifier 22.

Figure 7:
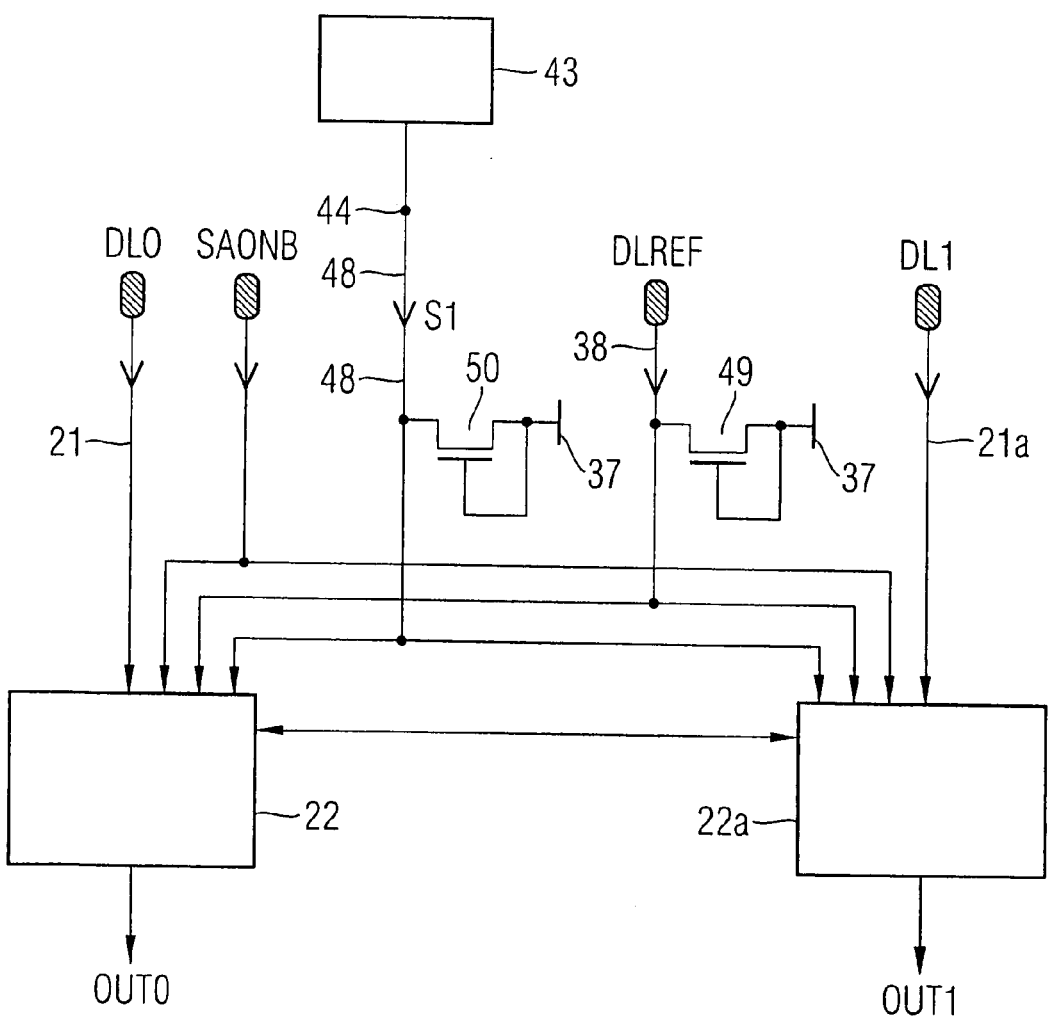
FIG. 7 is a block diagram of a third exemplary embodiment of a sense amplifier for the ROM memory of FIG. 3.

FIG. 7 shows a block diagram of a third exemplary embodiment of a sense amplifier for the ROM memory from FIG. 3. Two read-out circuits 22 such as are illustrated in FIG. 5 are provided in this exemplary embodiment. Each of said read-out circuits 22, 22a is connected via corresponding data lines 21, 21a to a respective memory cell array 11 (not illustrated in FIG. 7). Consequently, each of said read-out circuits 22, 22a is designed for reading a respective item of data information DL0, DL1 from a respective memory cell of the memory cell array, with the result that precisely two memory cells can be read during a read-out operation.

Preferably, in each case for both read-out circuits 22, 22a, provision is made of the same reference selection transistor 39 and, moreover, also the same reference column, containing the reference memory cells 40, within the memory cell array 11. Consequently, for the generation of the reference data signal DLREF, the two read-out circuits 22, 22a share at least partly common resources, in particular as far as the reference memory cells 40 and the selection transistors 39 within the bit multiplexer circuit are concerned. The same applies to the circuit 43, too, which is used by both read-out circuits 22, 22a.

Furthermore, each of the read-out circuits 22, 22a which in each case contain a selection transistor T0 according to FIG. 3 for the activation of the read-out circuit, can be controlled by means of the same control signal SAONB. The two read-out circuits 22, 22a can preferably also be coupled to one another.

Moreover, a respective device 49, 50 for load compensation is assigned to the reference bit line 38, on the one hand, and the control line 48, on the other hand. These devices 49, 50 for load compensation in each case contain an NFET, an NFET being connected to one of the lines 38, 48 on the output side. Moreover, the control terminal and the supply-side terminal of a respective NFET 49, 50 are short-circuited and connected to the supply terminal 37 for the reference potential VSS. These devices 49, 50 for load compensation 49, 50 are used for the purpose of compensating for a variation of the load present at the read-out circuits 22, 22a.

Figure 8:
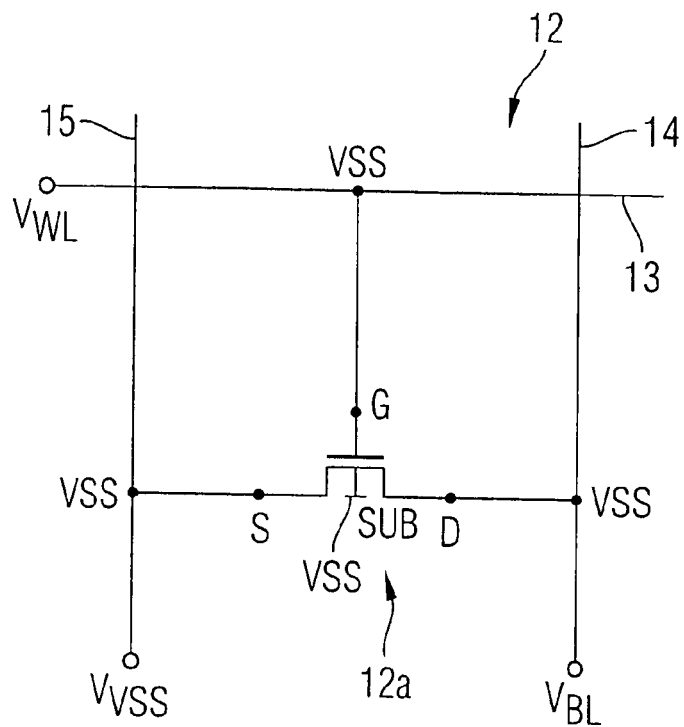
FIG. 8 is a circuit diagram of a first exemplary embodiment of an individual ROM memory cell such as can be used in the ROM memories of FIG. 2 or 3.

FIG. 8 shows a circuit diagram of a first exemplary embodiment of a ROM memory cell. The memory cell 12 has an NFET memory transistor 12a. The NFET 12a has a gate terminal G for switching the NFET 12a on and off in a controlled manner and also a source terminal S and a drain terminal D, between which the controlled path of the NFET 12a is present. The gate terminal G is connected to a word line 3, the drain terminal D is connected to a bit line 14 and the source terminal S is connected to a supply line 15. The NFET 12a furthermore has a substrate terminal SUB. The memory cell 12 in FIG. 8 is designed for storing a logic high level. Therefore, both the gate terminal G and the drain terminal D are connected respectively to the word line 13 and the bit line 14.

In standby operation of the memory cell 12, the reference potential VSS, in the present case where VSS=0 volts, is applied to the word line 13, the bit line 14 and the supply line 15 and thus to the corresponding terminals G, D, S. Moreover, the substrate terminal SUB is also at the reference potential VSS=0 volts. Consequently, in standby operation, the gate-source voltage dropped between source terminal S and gate terminal G is VGS=0 volts, and the drain-gate voltage dropped between drain terminal D and gate terminal G is VGD=0 volts. Consequently, since no voltage whatsoever is dropped between said terminals D, G, no leakage current whatsoever flows between gate and source and between gate and drain, irrespective of the thickness of the gate oxide of the NFET 12a. In standby operation, therefore, the gate current is zero amperes or is at least negligibly low. Since, moreover, a potential of zero volts is likewise applied to the substrate SUB, consequently, no voltage is likewise dropped between the source terminal S and the substrate terminal SUB and between the drain terminal D and the substrate terminal SUB Consequently, no leakage current whatsoever arises between source or drain terminal and the substrate either.

Figure 8A:
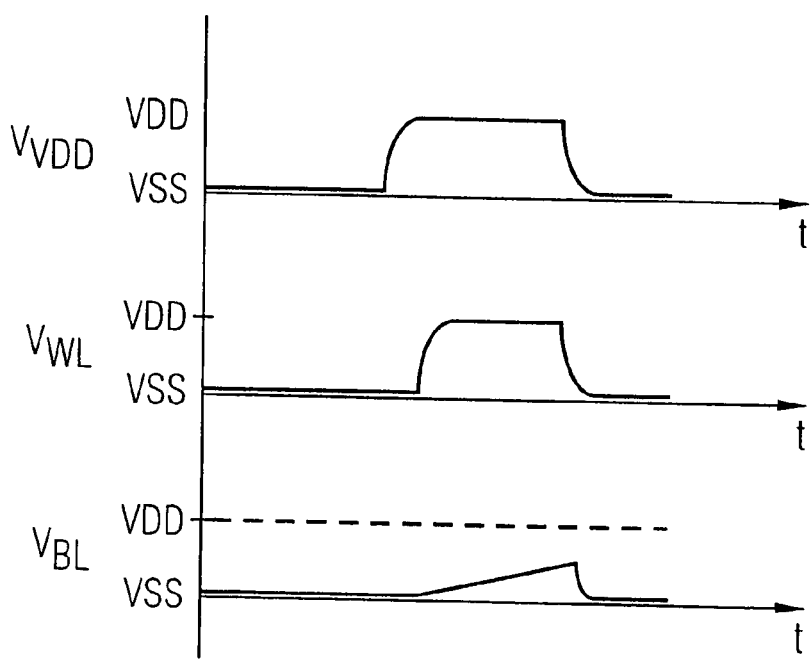
FIG. 8*a* are signal-time diagrams for a read-out operation of a ROM memory cell of FIG. 8.

FIG. 8a shows signal-time diagrams for a read-out operation of a ROM memory cell such as is illustrated in FIG. 8. The potential of the word line 13 is designated by VWL, the potential of the bit line 4 is designated by VBL and the potential of the supply line 15 is designated by VVDD. As has been explained already, with reference to FIG. 8, all of the lines 13, 14, 15 are at a reference potential VSS=0 volts prior to a read-out operation. In order to read out the information ("1") stored in the memory cell 12, the source terminal S is firstly precharged to a supply potential VDD via the supply line 5. After the precharging of the source terminal S or else actually during the precharging operation, a supply potential VDD is likewise applied to the gate terminal G via the word line 13, whereby the memory transistor 12a is turned on. On account of the voltage difference between source and drain, a drain-source current thus flows, which has the effect that the potential VBL at the drain terminal D and hence at the bit line 14 increasingly rises. This rising potential can be read out via the sense amplifier, which interprets this signal as a high logic level.

Typically, the precharging of the source terminal S via the supply line 15, in particular on account of the line capacitances within a ROM memory, is relatively incomplete, which also directly has the effect that the potential at the drain terminal also does not rise completely to the supply potential VDD. Typically, however, a certain potential swing of, for example, approximately 10%-50% of the supply potential VDD on the bit line 14 already suffices in order that this signal can be interpreted as a logic high level by the sense amplifier or can be differentiated from a logic low level. Even if the potential VSS on the supply line 15 does not reach the ideal value of the operating potential VDD during a read-out operation, the memory cell 1 has its maximum saturation current since the voltage VGS dropped between gate terminal G and source terminal S is identical to the supply potential VDD.

Figure 9:
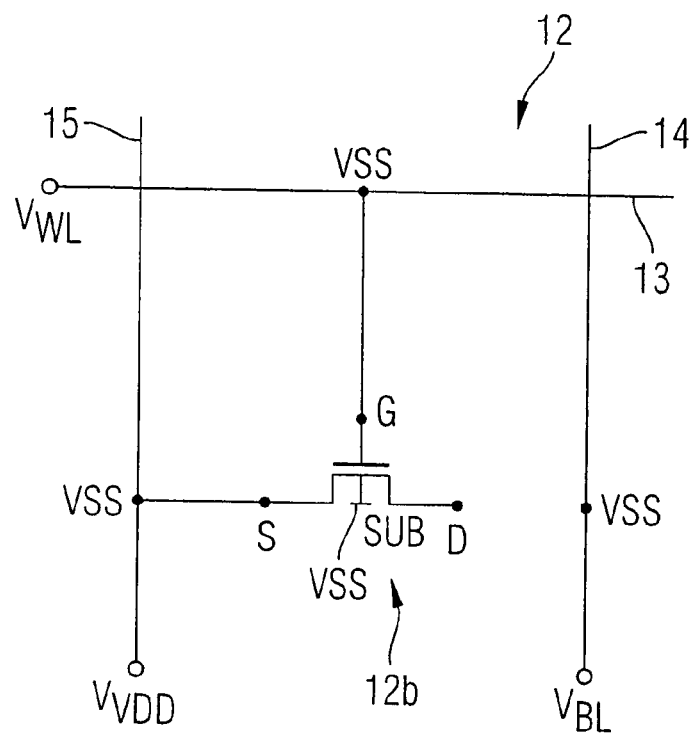
FIG. 9 is a circuit diagram of a second exemplary embodiment of an individual memory cell such as can be used in the ROM memories of FIG. 2 or 3.

FIG. 9 shows a circuit diagram of a second exemplary embodiment of a ROM memory cell, which is designed for storing a logic low level ("0"). In contrast to the exemplary embodiment in FIG. 8, here the drain terminal D of the NFET 12b is not connected to the bit line 14. The drain terminal D is thus as it were at a "floating", non-defined potential, for example on account of the substrate potential VSS at a potential close to the reference potential VSS. The source terminal S and the gate terminal G are still at a reference potential of VSS=0 volts. As above in the exemplary embodiment in FIG. 8, no leakage current whatsoever is produced between source and gate. In the same way, no leakage current is produced between the source terminal S and the substrate terminal SUB either. Only between the gate terminal G and the drain terminal D, on the one hand, and between the drain terminal D and the substrate terminal SUB are slight leakage currents produced, but they are likewise negligibly low on account of the fact that the drain terminal D is at a floating potential close to the reference potential VSS.

Figure 9A:
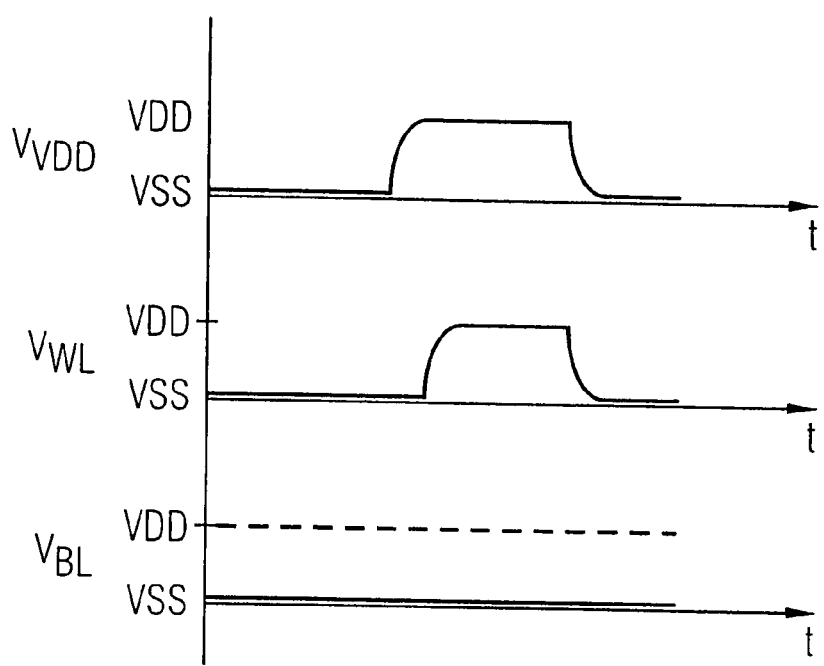
FIG. 9*a* are signal-time diagrams for a read-out operation of a ROM memory cell of to FIG. 9.

For a read-out operation (see FIG. 9a), firstly the supply line 15 is precharged with the supply potential VDD. The gate terminal G is subsequently charged with the supply potential VDD via the word line 31. Since the drain terminal D is not connected to the bit line 14, however, the bit line 14 remains at the reference potential VSS=0 volts, with the result that a sense amplifier interprets the content of said memory cell 12 as a low logic level.

Although the present invention has been described above, on the basis of advantageous exemplary embodiments, it shall not be restricted thereto, but rather can be modified in diverse ways.

Thus, the invention shall not be restricted exclusively to the use of memory transistors or selection transistors formed as NMOS transistors, but rather can of course also be extended to PMOS transistors. It goes without saying that other types of transistor, for example JFETs, bipolar transistors or the like can also be used as memory transistors, although MOSFETs are particularly well suited as memory transistors. Moreover, a multiplicity of different exemplary embodiments can be specified by interchanging the conductivity types N for P and vice versa.

It goes without saying that the circuit topographies of an individual ROM memory cell of the read-out circuitry and of the ROM memory can be modified or altered without departing from the essence of the invention.

An inverted logic with respect to that described in the invention would also be conceivable, that is to say that a high signal level corresponds to a "0" and a low signal level corresponds to "1".

Instead of the use of a reference potential of 0 volts, some other reference potential would also be conceivable of course.

Although only by way of example a small number of memory cells and only a single memory cell array of a ROM memory have been illustrated in the exemplary embodiments, it goes without saying that a ROM memory can be formed with arbitrary complexity and can correspondingly have an arbitrary multiplicity of memory cells and memory cell arrays.

What is claimed is:

1. A read-out circuit for or in a ROM memory, comprising:
    an input into which a read signal can be coupled, wherein the read signal, depending on the information contained in the read signal, comprising comprises a high signal level relative to a reference potential or a low signal level relative to a reference potential;
    a comparator circuit for comparing the read signal with an settable threshold;
    a threshold setting circuit designed for setting the threshold of the comparator circuit relative to the high and low signal levels; and
    a control signal generator for driving the threshold setting circuit, wherein the control signal generator generating generates a control signal similar to the read signal, wherein the threshold setting circuit comprises at least one second and one third transistor, which, relative to their controlled paths, are arranged in parallel with one another between a supply terminal and an output; the second transistor being connected to a reference input on a control side of the second transistor, into which reference input a reference read signal similar to the read signal can be coupled, and the third transistor being connected on a control side to a control input of the third transistor for coupling in the control signal.

2. The circuit of claim 1, wherein the control generator generates a signal similar to the read signal having the low signal level.

3. The circuit of claim 1, wherein the comparator circuit provides an output signal at an output; the output signal being assigned a high or a low logic level depending on the comparison of the read signal with the currently set threshold.

4. The circuit of claim 1, wherein the comparator circuit comprises two cross-coupled inverters.

5. The circuit of claim 1, wherein the threshold setting circuit is arranged between the input and the comparator circuit.

6. The circuit of claim 1, wherein the threshold setting circuit comprises at least two first transistors connected to an input on a control side of each of the first transistors and which, relative to their controlled paths, are arranged in parallel with one another between a supply terminal and the comparator circuit.

7. The circuit of claim 6, wherein the first transistors of the threshold setting device are arranged symmetrically with respect to one another.

8. The circuit of claim 1, wherein the second and third transistors of the threshold setting device are arranged symmetrically with respect to one another.

9. The circuit of claim 1, wherein the threshold setting circuit comprises at least two first transistors connected to an input on a control side of each of the first transistors and which, relative to their controlled paths, are arranged in parallel with one another between a supply terminal and the comparator circuit, and wherein the threshold setting circuit is formed in such a way that, during a read-out operation, the control terminal of the third transistor has the same gate-source coupling as the control terminals of the first and second transistors as a result of the control signal.

10. The circuit of claim 1, wherein the control signal generator comprises a fourth transistor corresponding to a selection transistor which can be connected to the read-out circuit and which is always turned on as a result of its driving and which feeds the reference potential to a control terminal of the third transistor via its controlled path.

11. The circuit of claim 1, wherein the control signal generator comprises a fifth transistor, whose control terminal is connected directly to the control terminal of the third transistor; the load terminals of the fifth transistor being short-circuited with one another and have the reference potential applied to them.

12. The circuit of claim 1, wherein at least two read-out circuits are provided which are connected to a respective memory cell array via respective data lines.

13. The circuit of claim 12, wherein the at least two read-out circuits are at least partly assigned the same threshold setting circuit.

14. The circuit of claim 12, wherein the at least two read-out circuits are assigned the same control signal generator.

15. The circuit of claim 1, wherein a pre-charging device is provided for pre-charging at least one of an input-side node, an output-side node, or a supply-side node within the threshold setting device with a predetermined potential or with the reference potential.

16. The circuit of claim 1, comprising at least one device for load compensation assigned to at least one of a reference bit line or a control line provided for the control signal, the at least one device for load compensation serving for the compensation of at least one of a load on the reference bit line or a load on the control line.

17. A ROM memory, comprising:
   at least one memory cell array comprising a multiplicity of leakage-current-optimized ROM memory cells;
   the read-out circuit of claim 1, by means of which read information can be read out from at least one of the memory cells; and
   a bit multiplexer circuit arranged between the memory cells array and the read-out circuit, wherein the bit multiplexer circuit connecting one of the memory cells to be read with regard to the stored information to the read-out circuit for a read-out operation.

18. The ROM memory of claim 17, further comprising a plurality of word lines, bit lines, and supply lines; the word lines, the bit lines; and the supply lines of a relevant of the memory cell arrays each having the identical reference potential applied to them in standby operation.

19. The ROM memory of claim 16, wherein a potential of 0 volts is provided as the reference potential.

20. The ROM memory of claims 17, wherein each memory cell of the memory cell array comprises a first terminal connected to a word line, and second and third terminals; the second terminal being connected to a bit line or the third terminal being connected to a supply line for pre-charging the third terminal, or the second terminal being connected to a bit line and the third terminal being connected to a supply line for pre-charging the third terminal.

21. The ROM memory of claim 17, wherein at least one of the memory cells comprises a memory transistor formed as an n-channel transistor or as an NMOS transistor.

22. The ROM memory of claim 21, wherein the memory transistor comprises a fourth terminal, which forms the substrate terminal of the memory transistor and to which the reference potential is applied in standby operation.

23. The ROM memory of claim 17, wherein at least one of the memory cells is designed for storing a first logic level, the second terminal is connected to the bit line, the third terminal is connected to the supply line, and the same reference potential is applied to all the terminals in a power-saving operation.

24. The ROM memory of claim 17, wherein at least one of the memory cells is designed for storing a second logic level, only the second terminal is connected to the bit line or only the third terminal is connected to the supply line or neither the second terminal is connected to the bit line nor the third terminal is connected to the supply line, and the same reference potential is applied to the terminal connected to the bit line and to the supply line, respectively, and also the first terminal.

25. The ROM memory of claim 23, wherein the first logic level denotes a logic high level and the second logic level denotes a logic low level.

26. The ROM memory of claim 15, wherein a device for pre-charging a plurality of supply lines is provided, which is designed for charging to a first potential, directly prior to a read-out of a memory cell at least the supply line assigned to the memory cell to be read.

27. The ROM memory of claim 17, wherein a respective bit line is assigned at least one selection transistor arranged with its controlled path between the bit line assigned to the selection transistor and the read-out circuit.

28. The ROM memory of claim 27, wherein the selection transistor is formed as an n-channel transistor or as an NMOS transistor.

29. The ROM memory of claim 17, wherein the that at least one memory cell array comprises a reference column comprising a plurality of reference memory cells connected to the reference input of the read-out circuit, wherein, during a read-out operation, a reference read signal is simultaneously read out from a reference memory cell corresponding to the memory cell read and is fed to the reference input.

30. The ROM memory of claim 27, wherein the bit multiplexer circuit comprises a reference selection transistor corresponding to the selection transistor, the reference selection transistor being arranged with its controlled path between the read-out circuit and a reference memory cells of the reference column.

31. A method for reading a ROM memory comprising the steps of:
   reading out an item of information from a memory cell;
   coupling a read signal comprising the information into a read-out circuit, wherein the read-out circuit is the read-out circuit of claim 1;
   the read signal, depending on the information contained, comprising a high signal level relative to a reference potential or a low signal level relative to a reference potential; setting a threshold of a comparator circuit relative to the low and high signal levels of the coupled-in read signals, wherein a control signal similar to the coupled-in read signal or to the read signal having the low signal level is generated for the purpose of setting the switching threshold; and comparing the read signal with the threshold set.

32. The method of claim 31, further comprising the step of: outputting an output signal assigned a high or a low logic level depending on the comparison of the read signal with the currently set threshold.

33. The method of claim 31, wherein at least one of an input-side node, an output-side node, or a supply-side node within the threshold setting device is pre-charged with a predetermined potential or with the reference potential prior to a read-out operation.

* * * * *